US005757020A

United States Patent [19]
Torazawa et al.

[11] Patent Number: 5,757,020
[45] Date of Patent: May 26, 1998

[54] PHOTOSEMICONDUCTOR RELAY, PHOTOSEMICONDUCTOR RELAY DEVICE, CONTROLLER USING PHOTOSEMICONDUCTOR RELAY, POWER SUPPLY APPARATUS USING PHOTOSEMICONDUCTOR RELAY AND TERMINAL SWITCHING APPARATUS USING PHOTOSEMICONDUCTOR RELAY

[75] Inventors: Hiroyasu Torazawa; Hiroaki Ogawa, both of Tokyo, Japan

[73] Assignee: Oki Electric Industry Co., Ltd., Tokyo, Japan

[21] Appl. No.: 845,207

[22] Filed: Apr. 21, 1997

Related U.S. Application Data

[63] Continuation of Ser. No. 518,400, Aug. 15, 1995, abandoned.

[30] Foreign Application Priority Data

Aug. 31, 1994 [JP] Japan ................................ 6-206549

[51] Int. Cl.[6] .............................. H03K 3/42; G02B 27/00
[52] U.S. Cl. ........................................... 250/551; 327/514
[58] Field of Search ............................ 250/551; 327/514, 327/313

[56] References Cited

U.S. PATENT DOCUMENTS

| 4,665,316 | 5/1987 | Hodges | 250/551 |
|---|---|---|---|
| 4,804,866 | 2/1989 | Akiyama | 250/551 |
| 5,151,602 | 9/1992 | Idaka et al. | 250/551 |
| 5,298,817 | 3/1994 | Banak et al. | 327/514 |
| 5,408,102 | 4/1995 | Okumura | 327/514 |
| 5,418,381 | 5/1995 | Aizawa | 250/551 |

FOREIGN PATENT DOCUMENTS

| 6-216738 | 8/1984 | Japan . |
|---|---|---|
| 1-090614 | 4/1989 | Japan . |
| 1-208015 | 8/1989 | Japan . |
| 1-208015A | 8/1989 | Japan . |
| 1-215072 | 8/1989 | Japan . |
| 5-167412 | 7/1993 | Japan . |
| 6-216738A | 8/1994 | Japan . |
| 7099433 | 4/1995 | Japan . |

*Primary Examiner*—Edward Westin
*Assistant Examiner*—Kevin Pyo
*Attorney, Agent, or Firm*—Spencer & Frank

[57] ABSTRACT

A photosemiconductor relay of the present invention comprises a light-emitting unit for emitting light therefrom, a light-receiving control circuit for providing a predetermined potential difference or more between a first connecting terminal and a second connecting terminal during a light-receiving period and electrically connecting the first and second connecting terminals to each other in response to the non-reception of the light, and a switching circuit for electrically connecting a first output terminal and a second output terminal to each other in response to the reception of the predetermined potential difference or more and restricting a load current flowing between the first and second output terminals to a predetermined value or less. Thus, since a current of a predetermined value or more does not flow into a load circuit connected between the output terminals, the load circuit is prevented from malfunctioning and the switching circuit is promptly turned off.

19 Claims, 10 Drawing Sheets

PHOTOSEMICONDUCTOR RELAY, PHOTOSEMICONDUCTOR RELAY DEVICE, CONTROLLER USING PHOTOSEMICONDUCTOR RELAY, POWER SUPPLY APPARATUS USING PHOTOSEMICONDUCTOR RELAY AND TERMINAL SWITCHING APPARATUS USING PHOTOSEMICONDUCTOR RELAY

This application is a continuation of application Ser. No. 08/518,400, filed Aug. 15, 1995, now abandoned.

BACKGROUND OF THE INVENTION

1. Field of the Invention

This invention relates to a photosemiconductor relay which has the function of restricting a load current and quickly responds to a switch-off action, a photosemiconductor relay device, a controller using the photosemiconductor relay, a power supply apparatus using the photosemiconductor relay and a terminal switching apparatus using the photosemiconductor relay

2. Description of the Related Art

A conventional photosemiconductor relay comprises a light-emitting unit for emitting light therefrom, a light-receiving unit for producing an electromotive force in response to the reception of the light and a switching circuit turned on in respose to receipt of the electromotive force. This type of photosemiconductor relay has been disclosed in Japanese Patent Application Laid-Open Publication Nos. 6-216738 and 1-208015, for example.

SUMMARY OF THE INVENTION

An object of the present invention is to provide a photosemiconductor relay which has the function of restricting a load current and quickly responds to a switch-off action, a controller using photosemiconductor relay devices and the photosemiconductor relays, a power supply apparatus and a terminal switching apparatus.

Another object of the present invention is to provide a photosemiconductor relay capable of reducing the resistance value of a resistor used for detecting a load current.

According to one aspect of the present invention, for achieving the above objects, there is provided a photosemiconductor relay comprising a light-emitting unit for emitting light therefrom, a light-receiving control circuit for applying a predetermined potential difference or more between a first connecting terminal and a second connecting terminal during a period in which the light is being received and electrically connecting the first connecting terminal and the second connecting terminal to each other in response to the non-reception of the light, and a switching circuit for electrically connecting a first output terminal and a second output terminal to each other in response to the predetermined potential difference or more and restricting a load current flowing between the first output terminal and the second output terminal to a predetermined range.

BRIEF DESCRIPTION OF THE DRAWINGS

While the specification concludes with claims particularly pointing out and distinctly claiming the subject matter which is regarded as the invention, it is believed that the invention, the objects, features of the invention and further objects, features and advantages thereof will be better understood from the following description taken in connection with the accompanying drawings in which:

DETAILED DESCRIPTION OF THE PREFERRED EMBODIMENTS

Figure 1:
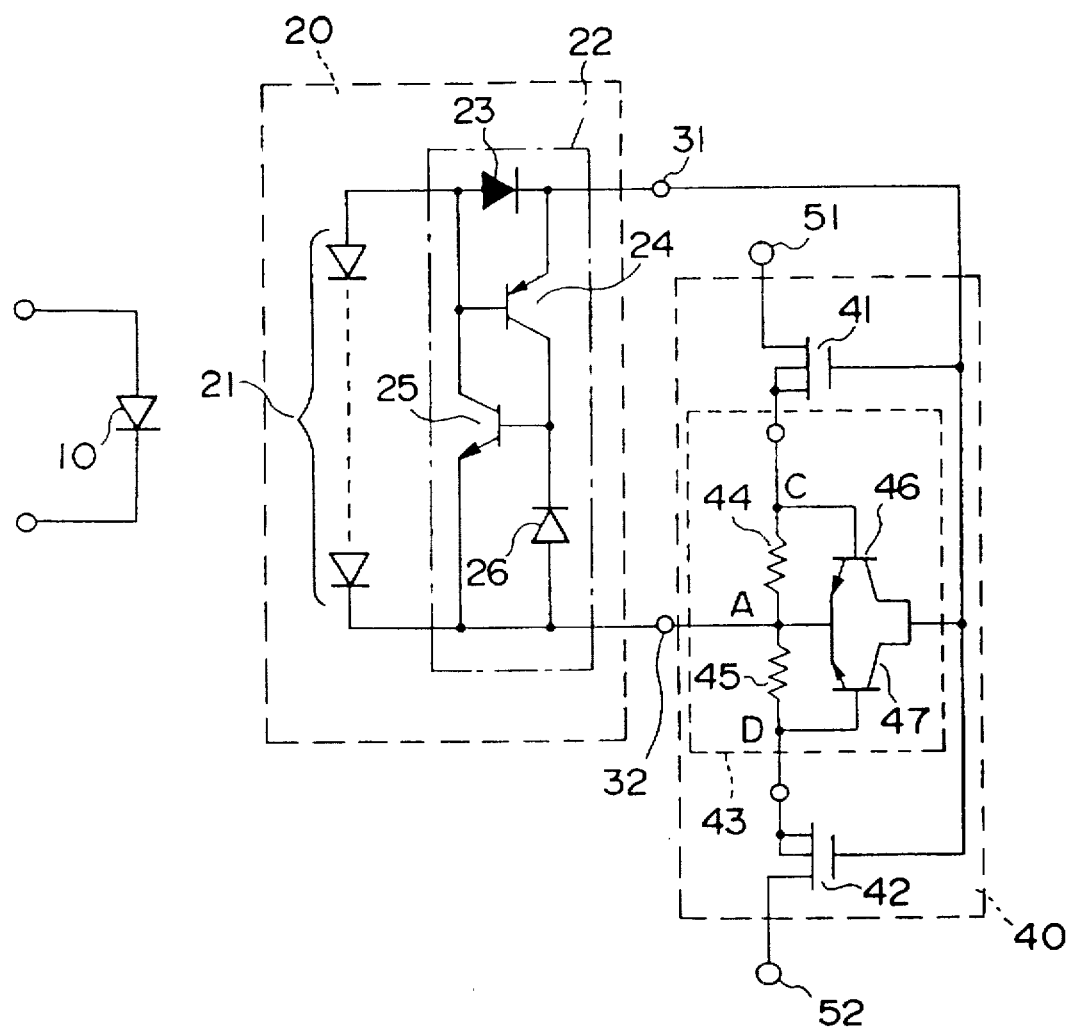
FIG. 1 is a circuit diagram showing a photosemiconductor relay according to a first embodiment of the present invention.

Preferred embodiments of the present invention will hereinafter be described with reference to the accompanying drawings.

A photosemiconductor relay according to a first embodiment of the present invention will first be described with reference to FIG. 1.

The photosemiconductor relay according to the first embodiment comprises a light-emitting diode 10 which serves as a light-emitting unit, a light-receiving control circuit 20 and a switching circuit 40.

The light-emitting diode 10 emits light when biased in the forward direction.

The light-receiving control circuit 20 comprises a photodiode array 21 and a control circuit 22. The photodiode array 21 generates an electromotive force in response to received light. The control circuit 22 comprises a diode 23, a PNP bipolar transistor (hereinafter called "PNP transistor") 24, an NPN bipolar transistor (hereinafter called "NPN transistor") 25 and a photodiode 26. The anode of the diode 23 is electrically connected to the base of the PNP transistor 24, the collector of the NPN transistor 25 and the anode of the photodiode array 21. The cathode of the diode 23 is electrically connected to a terminal 31 which serves as a first connecting terminal. The emitter of the PNP transistor 24 is electrically connected to the terminal 31. The collector of the PNP transistor 24 is electrically connected to the cathode of the photodiode 26 and the base of the NPN transistor 25. The anode of the photodiode 26, the emitter of the NPN transistor 25 and the cathode of the photodiode array 21 are electrically connected to a terminal 32 which serves as a second terminal.

The switching circuit 40 comprises an N-Metal Oxide Semiconductor Field Effect Transistor (hereinafter called "MOS transistor") 41, a MOS transistor 42 which serves as a second transistor and a current-limiting circuit 43.

The current-limiting circuit 43 comprises a resistor 44 which serves as a first resistor, a resistor 45 which serves as a second resistor, an NPN transistor 46 and an NPN transistor 47. The resistor 44 and the resistor 45 are formed as diffused resistors. The resistance value of each of the resistors 44 and 45 is 2.2Ω, for example. The base of the NPN transistor 46 is electrically connected to one end of the resistor 44 and the source of the MOS transistor 41. The base of the NPN transistor 47 is electrically connected to one end of the resistor 45 and the source of the MOS transistor 42. The emitter of the NPN transistor 46, the emitter of the NPN transistor 47, the other end of the resistor 44 and the other end of the resistor 45 are electrically connected to the terminal 32. The collector of the NPN transistor 46, the collector of the NPN transistor 47, the gate of the MOS transistor 41 and the gate of the MOS transistor 42 are electrically connected to the terminal 31. The drain of the MOS transistor 41 is electrically connected to an output terminal 51. Further, the drain of the MOS transistor 42 is electrically connected to an output terminal 52.

The operation of the photosemiconductor relay shown in FIG. 1 will now be described.

When the light-emitting diode 10 emits light, the photodiode array 21 and the photodiode 26 receive the light emitted from the light-emitting diode 10. The photodiode array 21 generates an electromotive force in response to the emitted light. When the photodiode 26 is turned on, a reverse bias is applied between the base and emitter of the NPN transistor 25. Thus, the NPN transistor 25 is turned off so that the impedance between the terminals 31 and 32 is brought to a high impedance and hence a potential difference is developed between the terminals 31 and 32, thereby making it possible to apply a potential difference between the gate and source of each of the MOS transistors 41 and 42. Thus, the MOS transistors 41 and 42 are turned on to provide conduction between the output terminals 51 and 52. As a result, a load current flows from a connecting node C to a connecting node D or from the node D to the node C by a load circuit electrically connected between the output terminals 51 and 52.

A description will now be made of the case where the load current flows from the node C to the node D.

Now, consider that the load current starts to flow and the load current reaches 240 mA, for example, due to the falling of a thunderbolt. When the resistance value of the resistor 44 is set to 2.2Ω, for example, a voltage drop of about 0.5V is developed across the resistor 44 by the load current. Thus, the NPN transistor 46 is biased in the forward direction and the NPN transistor 46 is turned on so as to electrically connect between the collector and emitter thereof. As a result, the sources and gates of the MOS transistors 41 and 42 are respectively electrically connected to each other (i.e., they are short-circuited). Thus, electric charges stored in the gates of the MOS transistors 41 and 42 are discharged to the sources thereof and the MOS transistors 41 and 42 are changed in a turning-off direction. Therefore, the load current is reduced.

Next, when the load current is decreased, the voltage drop developed across the resistor 44 is lowered and the NPN transistor 46 is changed in a turning-off direction. Thus, the difference in potential between the source and gate of each of the MOS transistors 41 and 42 becomes large. As a result, each of the MOS transistors 41 and 42 is changed in the turning-on direction again. When the load current reaches a limiting value, the above operation is hereafter repeated and the current- limiting circuit 43 restricts the load current to a predetermined limiting value or less.

On the other hand, the resistor 45 and the NPN transistor 47 limit the load current flowing from the node D to the node C in the same manner as described above.

Next, when the light-emitting diode 10 stops the emission of light, the PNP transistor 24 and the NPN transistor 25 are brought into conduction and the gate and source of each of the MOS transistors 41 and 42 are electrically connected to each other (i.e., they are short-circuited). Thus, the electric charges stored in the gates of the MOS transistors 41 and 42 are discharged to the sources thereof and the output terminal 51 and the output terminal 52 are electrically separated from each other.

Figure 2:
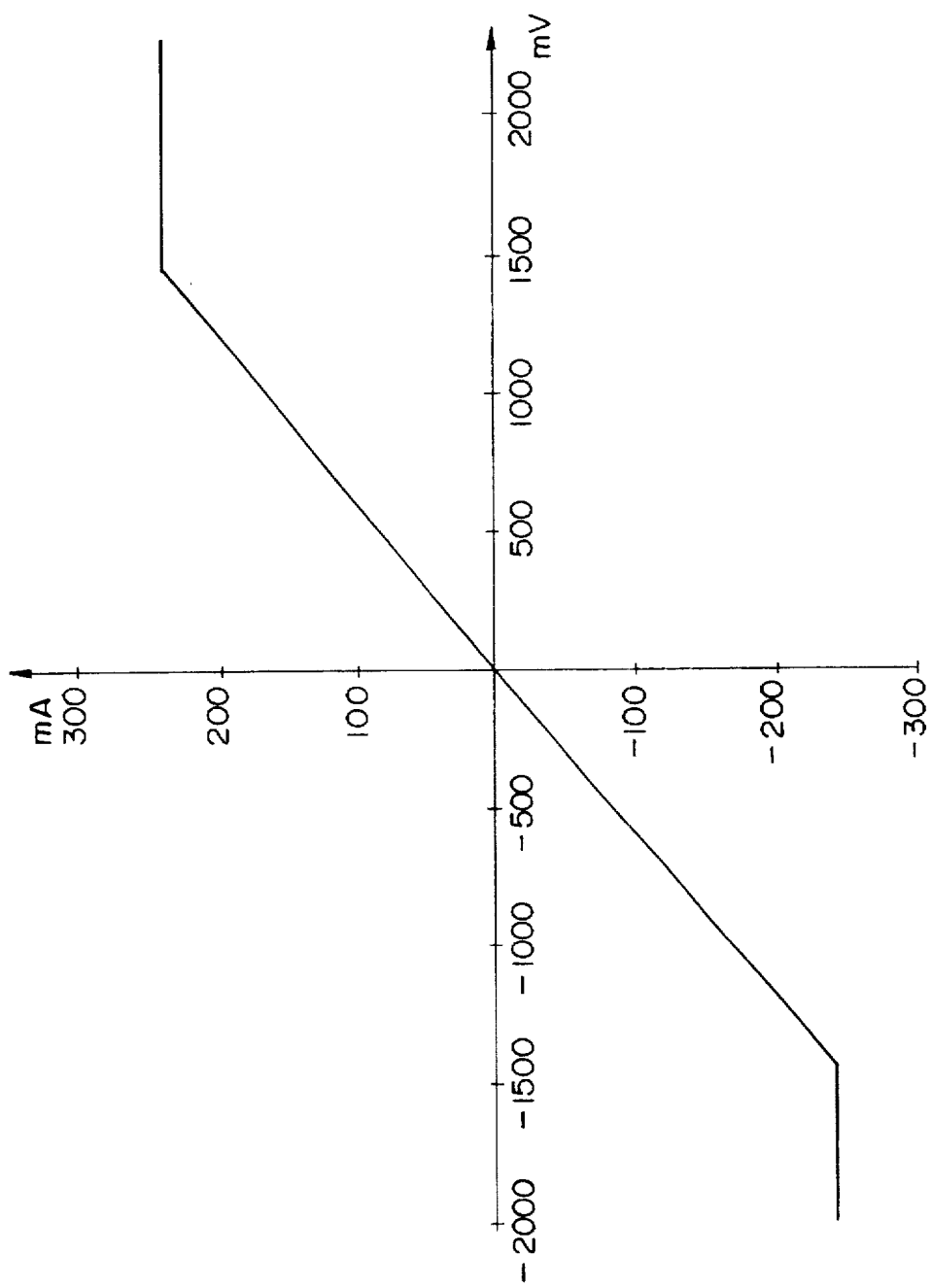
FIG. 2 is a view illustrating an electrical characteristic of the photosemiconductor relay shown in FIG. 1.

FIG. 2 is a view illustrating an electrical characteristic of the photosemiconductor relay shown in FIG. 1. The electrical characteristic shown in FIG. 2 is one obtained when the resistance values of the resistors 44 and 45 are respectively set to 2.2Ω and the on resistances of the MOS transistors 41 and 42 are respectively set to 0.75Ω. In FIG. 2, the axis of abscissas represents a difference in potential between the output terminals 51 and 52 and the axis of ordinates represents a load current that flows between the output terminals 51 and 52. As shown in FIG. 2, the current-limiting circuit 43 of the photosemiconductor relay shown in FIG. 1 limits the load current so that the load current does not exceed a current-limiting value of 240 mA.

Thus, in the present invention, the current-limiting circuit 43 prevents an overcurrent from flowing. It is therefore possible to prevent the load circuit connected ellectrically between the output terminals 51 and 52 from malfunctioning due to the flow of overcurrent in the photosemiconductor relay. Since the light-receiving control circuit 20 electrically connects the terminals 31 and 32 to each other (i.e., the two terminals 31 and 32 are short-circuited) after the light-receiving control circuit 20 has stopped receiving light, the MOS transistors 41 and 42 are promptly turned off.

Figure 3:
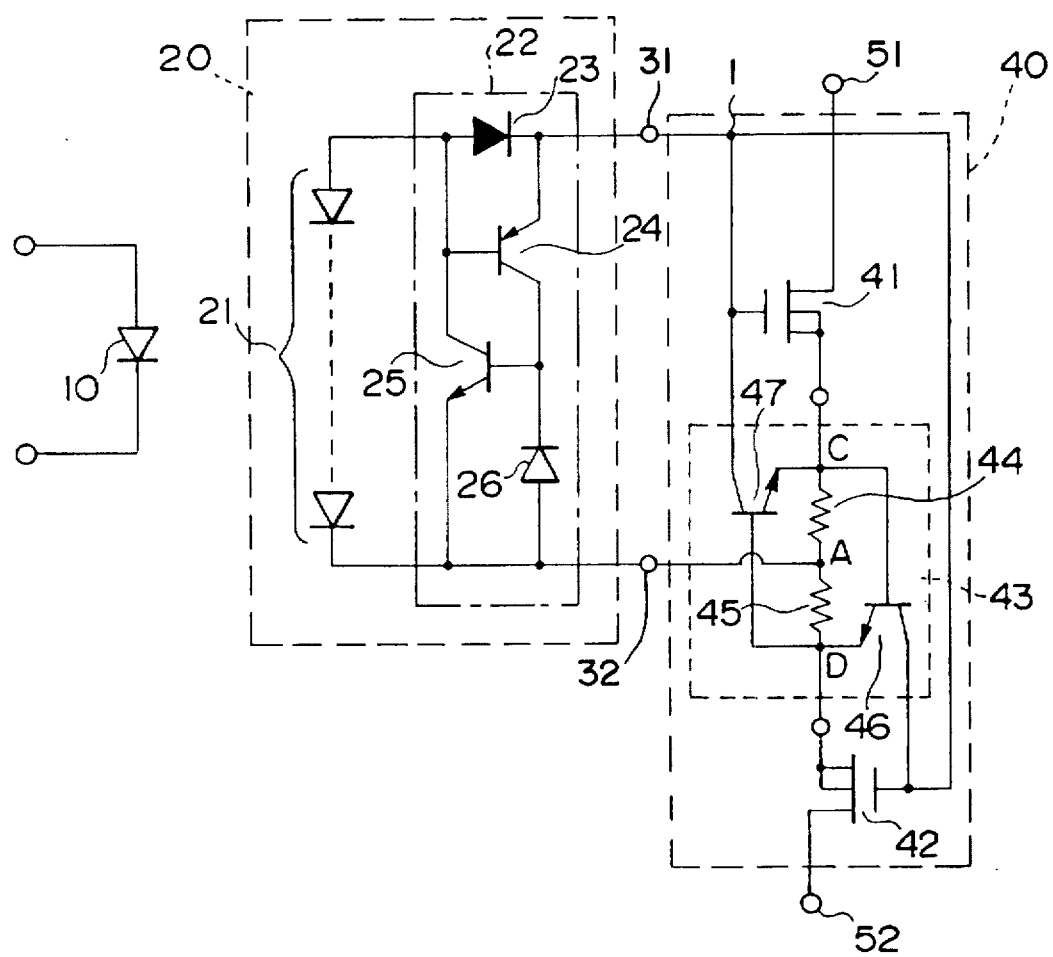
FIG. 3 is a circuit diagram showing a photosemiconductor relay according to a second embodiment of the present invention.

FIG. 3 is a circuit diagram showing a photosemiconductor relay according to a second embodiment of the present invention. In FIG. 3, elements common or equivalent to those shown in FIG. 1 are identified by like reference numerals and their description will therefore be omitted. The photosemiconductor relay shown in FIG. 3 is equivalent to a circuit wherein the emitter of the NPN transistor 46 (which is shown connected to a connecting node A in FIG. 1) is electrically connected to a connecting node D shown in FIG. 3, the emitter of the NPN transistor 47 (which is shown connected to the node A in FIG. 1 is electrically connected to a connecting node C shown in FIG. 3 , the resistance value of the resistor 44 is set to 1.1Ω and the resistance value of the resistor 45 is set to 1.1Ω.

The operation of the photosemiconductor relay shown in FIG. 3 will now be described.

When the load current reaches 240 mA in a manner similar to the photosemiconductor relay shown in FIG. 1, a voltage drop of about 0.5V is developed between the node C and the node D. Thus, the NPN transistor 46 is forward-biased to provide conduction between the collector and emitter of the NPN transistor 46. As a result, the sources and gates of MOS transistors 41 and 42 are respectively electrically connected to one another (i.e., they are short-circuited). Thus, electric charges stored in the gates of the MOS transistors 41 and 42 are discharged to the sources thereof and the MOS transistors 41 and 42 are changed in a turning-off direction. Therefore, the load current is reduced.

Next, when the load current is decreased, the voltage drop developed between the nodes C and D is lowered and the NPN transistor 46 is changed in a turning-off direction.

Thus, the difference in potential between the source and gate of each of the MOS transistors 41 and 42 becomes large. As a result, each of the MOS transistors 41 and 42 is changed in the turning-on direction again. When the load current reaches a limiting value, the above operation is hereafter repeated and a current-limiting circuit 43 restricts the load current to a predetermined limiting value or less.

After the light-receiving control circuit 20 has not received the light, the circuit shown in FIG. 3 is operated in a manner similar to the circuit shown in FIG. 1.

Figure 4:
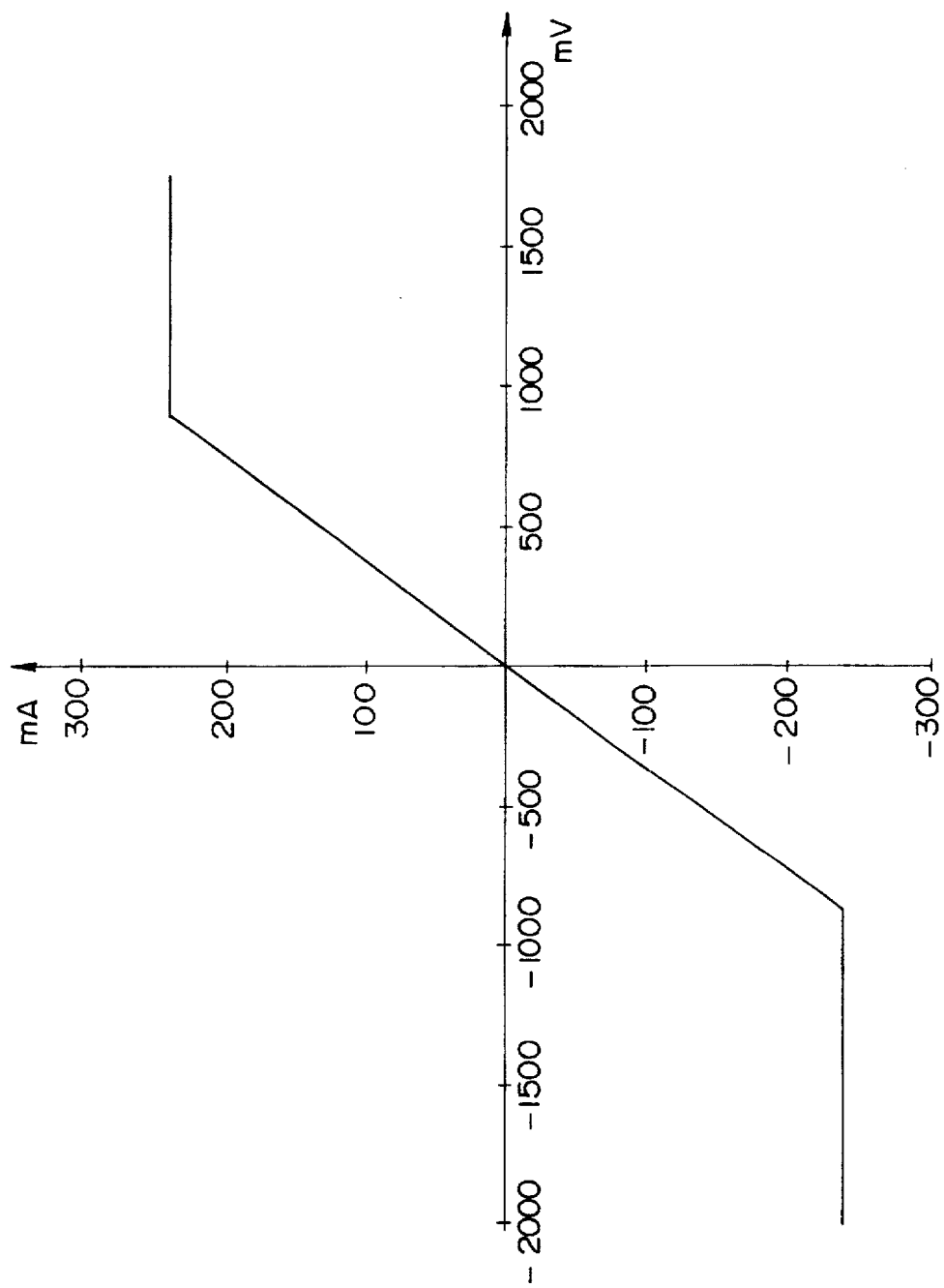
FIG. 4 is a view illustrating an electrical characteristic of the photosemiconductor relay shown in FIG. 3.

FIG. 4 is a view for describing an electrical characteristic of the photosemiconductor relay shown in FIG. 3. The electrical characteristic illustrated in FIG. 4 is one obtained when the resistance value of the resistor 44 is set to 1.1Ω, and the resistance value of the resistor 45 is set to 1.1Ω, the on resistance of the MOS transistors 41 is set to 0.75Ω, and the on resistance of the MOS transistors 41 is set to 0.75Ω. In FIG. 4, the axis of abscissas represents a potential in diferrence developed between output terminals 51 and 52 and the axis of ordinates represents a load current that flows between the output terminals 51 and 52. The current-limiting circuit 43 of the photosemiconductor relay shown in FIG. 3 limits the load current so that the load current does not exceed a current-limiting value of 240 mA as illustrated in FIG. 4.

In order to limit the value of the load current that flows between the output terminals 51 and 52 to 240 mA, the photosemiconductor relay shown in FIG. 1 needed to have a resistance of 4.4Ω (resistance value of resistor 44=2.2Ω and resistance value of resistor 45=2.2Ω). In the photosemiconductor relay shown in FIG. 3, however, the load current is limited by a resistance of 2.2Ω (resistance value of resistor 44=1.1Ω and resistance value of resistor 45=1.1Ω).

The resistance value obtained by adding the resistance values of the resistors 44 and 45 together becomes 2.2Ω the on resistance values of the MOS transistor 41 is 0.75Ω and the on resistance values of the MOS transistor 42 is 0.75Ω. Thus, the on resistance values of the photosemiconductor relay shown in FIG. 3 becomes 3.7Ω. On the other hand, the on resistance value of the photosemiconductor relay shown in FIG. 1 becomes one obtained by adding the total resistance value (4.4Ω) of the resistors 44 and 45, the on resistance value of the MOS transistor 41 and the on resistance value of the MOS transistor 42 together. In other words, the total on resistance value of the photosemiconductor relay shown in FIG. 3 reaches 5.9Ω.

It is generally desired that the on resistance value of the photosemiconductor relay is low in terms of generated heat or the like. Since the photosemiconductor relay according to the second embodiment has a low on resistance value, such a photosemiconductor relay has a desirable characteristic from the viewpoint of the generated heat or the like.

Figure 5:
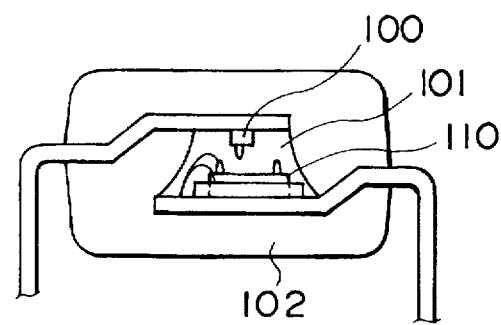
FIG. 5 is a cross-sectional view depicting a photosemiconductor relay device according to the present invention.

FIG. 5 is a cross-sectional view showing a photosemiconductor relay device in which the photosemiconductor relay according to the first or second embodiment is formed.

The light-emitting diode 10 is formed on a light-emitting chip 100. The light-receiving control circuit 20 and the current-limiting circuit 43 are formed on a light-receiving chip 110.

The light-emitting chip 100 is provided as opposed to the light-receiving chip 110. A transparent resin 101 is formed between the light-emitting chip 100 and the light-receiving chip 110. Further, the light-emitting chip 100, the transparent resin 101 and the light-receiving chip 110 are sealed by a molded resin 102.

Figure 6:
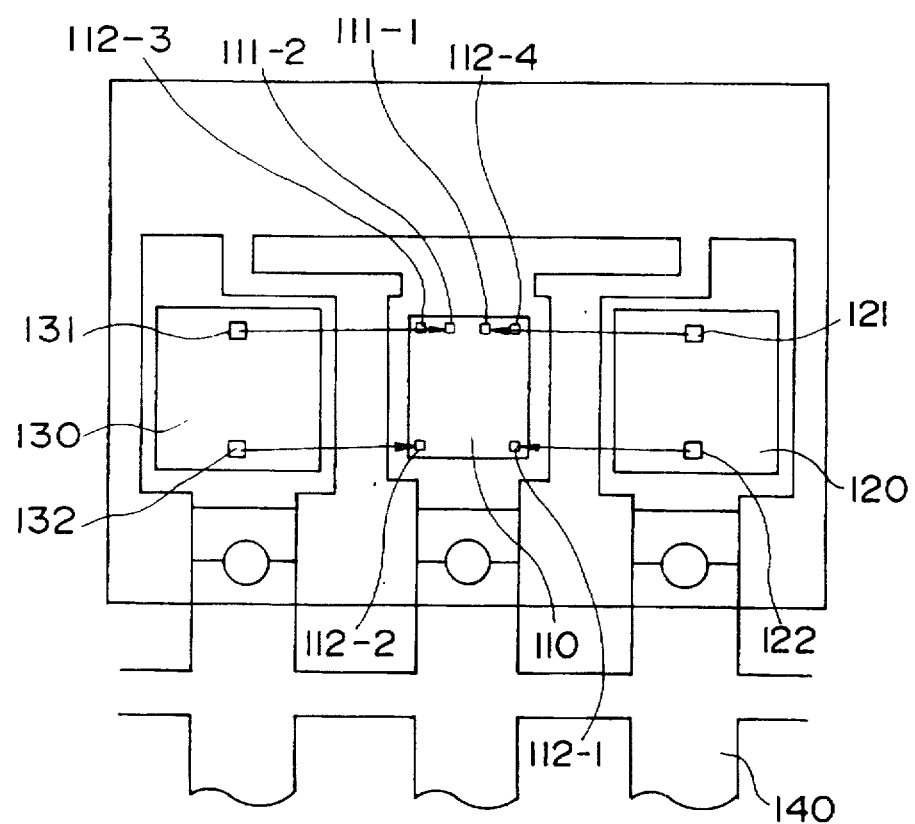
FIG. 6 is a view illustrating the layout of chips for the photosemiconductor relay device shown in FIG. 5.

FIG. 6 is a view for describing the layout of wire bonding of chips for the photosemiconductor relay device shown in FIG. 5. FIG. 6 is a chip layout for describing, in detail, wire bodingof the light-receiving chip 110, an output chip 120 on which the MOS transistor 41 is formed, and an output chip 130 on which the MOS transistor 42 is formed.

As shown in FIG. 6, two output chips on which Vertical Diffusion MOSs are formed on both sides of the light-receiving chip 110, are arranged with the light-receiving chip 110 as the center. A source connecting pad 121 of the output chip 120 is electrically connected to a source connecting pad 111-1 of the light-receiving chip 110 by a bonding wire. A gate connecting pad 122 of the output chip 120 is electrically connected to a gate connecting pad 112-1 of the light-receiving chip 110 by a bonding wire. A source connecting pad 131 of the output chip 130 is electrically connected to a source connecting pad 111-2 of the light-receiving chip 110 by a bonding wire. A gate connecting pad 132 of the output chip 130 is electrically connected to a gate connecting pad 112-2 of the light-receiving chip 110 by a bonding wire. The output chips 120 and 130 are electrically connected to a lead frame 140 used for an output terminal.

Figure 7A:
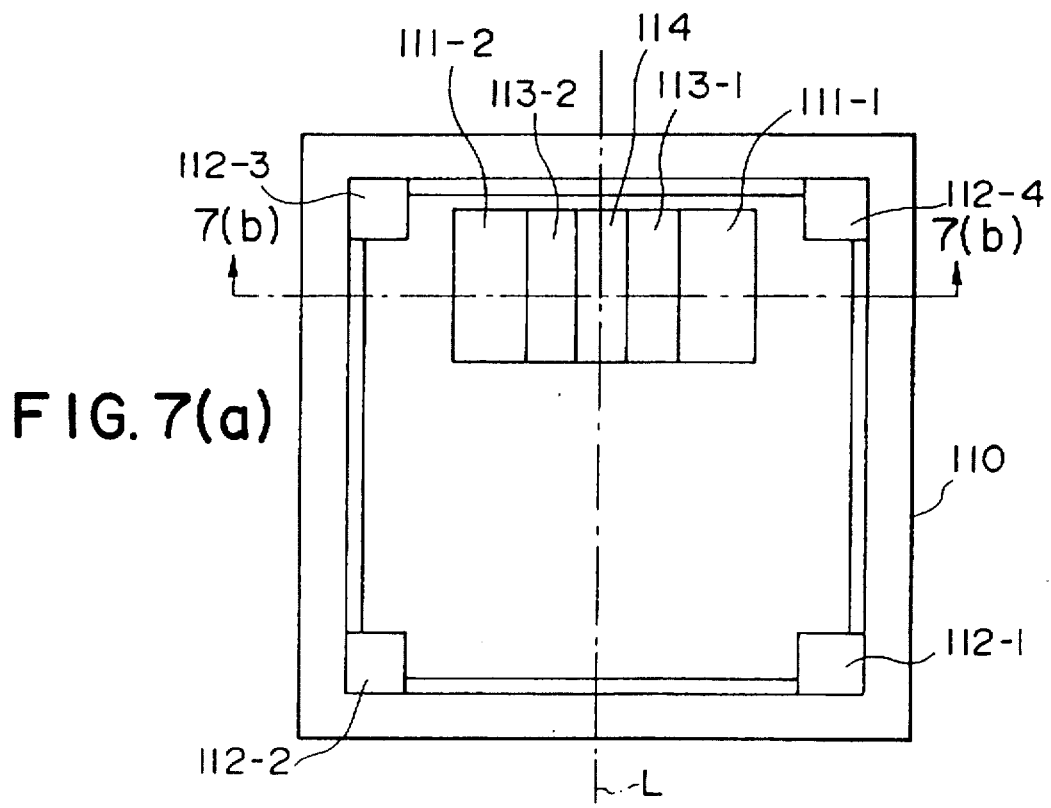
FIG. 7(a) is a view showing the layout of a light-receiving chip 110.
Figure 7B:
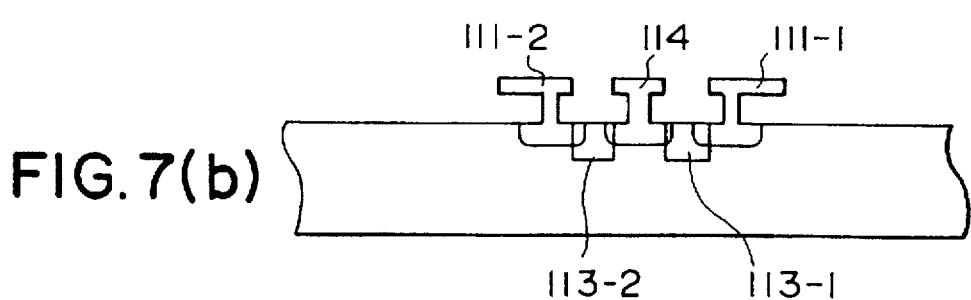
FIG. 7(b) is a cross-sectional view taken along line 7(b)—7(b) of FIG. 7(a)

FIG. 7(a) is a view for describing the layout of the light-receiving chip 110. FIG. 7(b) is a cross-sectional view taken along line 7(b)—7(b) of FIG. 7(a).

The light-receiving chip 110 includes the gate connecting pads 112-1 through 112-4 provided at the four corners thereof. An electrode 114 composed of an alloy of aluminum and silicon is disposed on the central line L of the light-receiving chip 110 and in a peripheral position of the light-receiving chip 110. A resistor 113-1 (identical to the resistor 44) and a resistor 113-2 (identical to the resistor 45), both electrically connected to the electrode 114 and formed on both sides of the electrode 114 as diffusion resistors, are disposed within the light-receiving chip 110. The source connecting pad 111-1 is disposed in the immediate vicinity of the resistor 113-1. The source connecting pad 111-2 is disposed in the immediate vicinity of the resistor 113-2. Further, a photodiode 2 (not shown) is disposed in the center of the light-receiving chip 110. Furthermore, the control circuit 22 and the NPN transistors 46 and 47 of the current-limiting circuit 43 are provided around and within the light-receiving chip 110. The electrode 114 corresponds to each of the nodes A shown in FIGS. 1 and 3.

Since the resistors 113-1 and 113-2 are provided within the light-receiving chip 110, a load current of a few hundred mA continuously flows. As a result, there is a possibility of occurrence of electromigration or the like. Thus, in order to avoid the electromigration or the like, the source connecting pad 111 -1 is disposed in the immediate vicinity of the resistor 113-1 and the source connecting pad 111-2 is provided in the immediate vicinity of the resistor 113-2. Further, the width of a conductor for electrically connecting the resistor 113-1 and the source connecting pad 111 -1 to each other and the width of a conductor for electrically connecting the resistor 113-2 and the source connecting pad 111-2 to each other are respectively broadened to reduce the density of load current. The following contrivances have been made so as not to interfere with the sensitivity of light-reception of the photodiode. The source connecting pads 111-1 and 111-2 are disposed around and within the light-receiving chip 110 in such a manner that the bonding wire for electrically connecting the source connecting pad 111-1 and the source connecting pad 121 of the output chip 120 to each other and 5 the bonding wire for electrically connecting the source connecting pad 111-2 and the source connecting pad 131 of the output chip 130 to each other do not cross over the photodiode. The gate connecting pads 112-1 through 112-4 are provided at the four corners of the light-receiving chip 110 to provide convenience for the wire bonding. The gate connecting pads 112-1 through 112-4 are electrically connected to the terminal 31. Further, the electrode 114 is disposed in the center of the light-receiving chip 110 so that the distance between the resistor 113-1 and the electrode 114 and the distance between the resistor 113-2 and the electrode 114 become equal to each other upon bonding.

Now, only four wires are used to provide electrical connection between the light-receiving chip 110 and the output chips.

As a photosemiconductor relay product, there is known one called a multi-contact type product (hereinafter called "two-channel (2ch) type product") of a type wherein a plurality of semiconductor relays are provided within the same device. This is one wherein two photosemiconductor relays are provided within a single photosemiconductor relay device.

Figure 8:
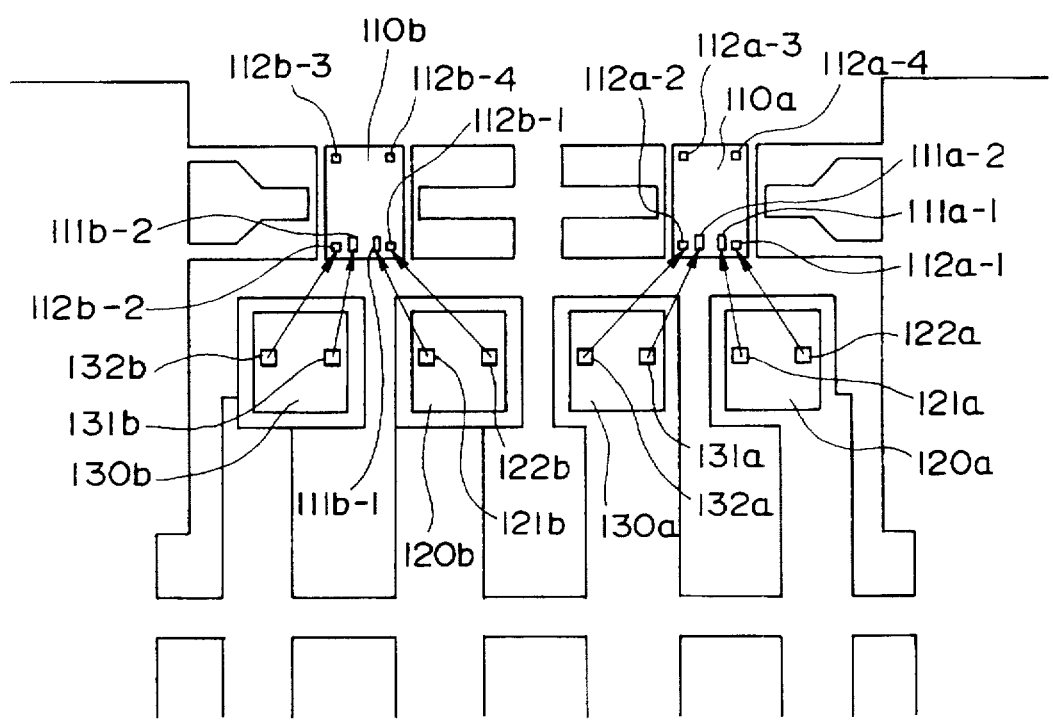
FIG. 8 is a view illustrating the layout of chips for a 2-channel semiconductor relay according to the present invention.

FIG. 8 is a view for describing the layout of wire bonding among chips for the two-channel type photosemiconductor relay according to the present invention.

Designated at symbols 110a and 110b in FIG. 8 are light-receiving chips. Designated at symbols 120a, 120b, 130a and 130b are output chips respectively. Reference symbols 111a-1, 111a-2, 111b-1, 111b-2, 121a, 121b, 131a and 131b indicate source connecting pads respectively.

Designated at symbols 112a-1 through 112a-4, 112b-1 through 112b-4, 122a, 122b, 132a and 132b are gate connecting pads respectively.

The source connecting pads 111a-1 and 121a are electrically connected to each other by a bonding wire. The source connecting pads 111a-2 and 131a are electrically connected to each other by a bonding wire.

The gate connecting pads 112a-1 and 122a are electrically connected to each other by a bonding wire. Further, the gate connecting pads 112a-2 and 132a are electrically connected to each other by a bonding wire.

The source connecting pads 111b-1 and 121b are electrically connected to each other by a bonding wire. The source connecting pads 111b-2 and 131b are electrically connected to each other by a boding wire. The gate connecting pads 112b-1 and 122b are electrically connected to on each other by a bonding wire. Further, the gate connecting pads 112b-2 and 132b are electrically connected to each other by a bonding wire.

The 2ch type photosemiconductor relay according to the present invention is wire-bonded by four wires per 1ch.

Figure 9:
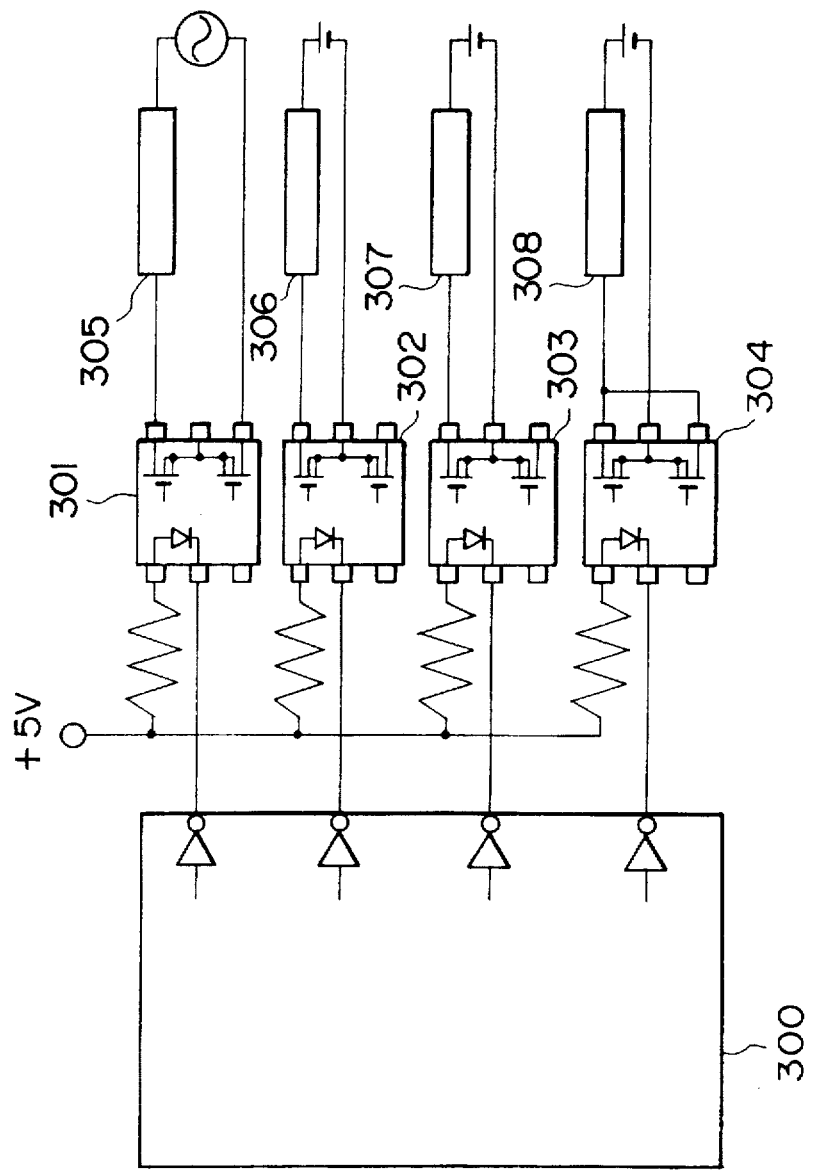
FIG. 9 is a view showing the configuration of a controller according to the present invention.

FIG. 9 is a view illustrating the configuration of a controller according to the present invention. Photosemiconductor relay devices 301 through 304, each equipped with a photosemiconductor relay according to the first or second embodiment, are employed in the controller shown in FIG. 9.

Negative input terminals of light-emitting units of the photosemiconductor relay devices 301 through 304 are electrically connected to the output side of the controller 300. A power source potential of 5V is electrically connected to positive input terminals of the photosemiconductor relay devices 301 through 304.

An AC motor 305 is electrically connected to one of the output terminals of the photosemiconductor relay device 301. An A.C.source is electrically connected to the other output terminal of the photosemiconductor relay device 301. A DC motor 306 is electrically connected to an output terminal of the photosemiconductor relay device 302. A D.C. supply is electrically connected to an output terminal coupled to the source of a MOS transistor of the photosemiconductor relay device 302. A display LED 307 is electrically connected to one of output terminals of the photosemiconductor relay device 303 and a D.C. supply is electrically connected to an output terminal coupled to the source of a MOS transistor of the photosemiconductor relay device 303. A large current load 308 is electrically connected commonly to two output terminals of the photosemiconductor relay device 304. A D.C. supply is electrically connected to the source of a MOS transistor of the photosemiconductor relay device 304.

The operation of the controller will now be described. The controller 300 outputs a control signal to one of the light-emitting units of the photosemiconductor relay devices 301 through 304 to turn on the one of the photosemiconductor relay devices 301 through 304. Thus, loads such as the AC motor 305, etc. connected to the photosemiconductor relay device brought into the on state are driven. Since, at this time, each of the photosemiconductor relay devices 301 through 304 has a current-limiting function, an overcurrent is prevented from flowing therein even if, for example, a thunderbolt falls, thereby making it possible to prevent the load circuits such as the AC motor from malfunction or the like.

According to the controller of the present invention, since an overcurrent can be prevented from flowing because each of the photosemiconductor relay devices 301 through 304 has the current-limiting function, the load circuits such as the AC motor, etc. do not malfunction.

Figure 10:
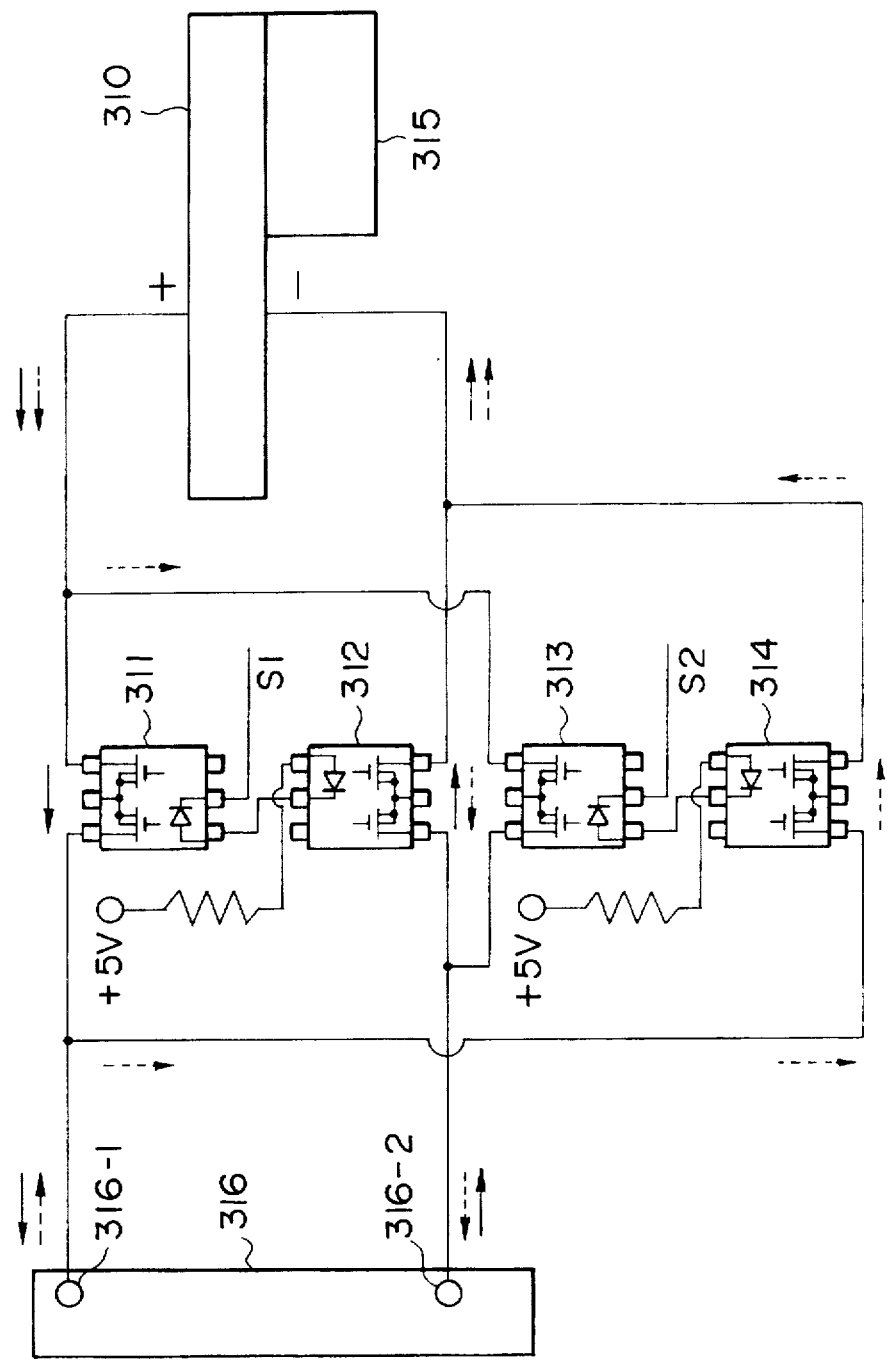
FIG. 10 is a view depicting a configuration of a power supply apparatus according to the present invention.

FIG. 10 is a view showing the configuration of a power supply apparatus using photosemiconductor relays according to the first or second embodiment of the present invention.

One of the output terminals of a photosemiconductor relay device 311 and one of the output terminals of a photosemiconductor relay device 313 are electrically connected to the positive side of the power supply unit 310 for supplying power. One of output terminals of a photosemiconductor relay device 312 and one of output terminals of a photosemiconductor relay device 314 are electrically connected to the negative side of the power supply unit 310. The other of the output terminals of the photosemiconductor relay device 311 and the other of the output terminals of the photosemiconductor relay device 314 are electrically connected to one output terminal 316-1 of an output unit 316 for outputting power therefrom.

The other of the output terminals of the photosemiconductor relay device 312 and the other of the output terminals of the photosemiconductor relay device 313 are electrically connected to the other output terminal 316-2 of the output unit 316. Input terminals of light-emitting units of the photosemiconductor relay devices 311 and 312 are electrically connected to each other. Input terminals of light-emitting units of the photosemiconductor relay devices 313 and 314 are electrically connected to each other. A switching signal S1 for controlling the emission of light is inputted to the other input terminal of the light-emitting unit of the photosemiconductor relay device 311. A power source potential of 5V is electrically connected to the other input terminal of the light-emitting unit of the photosemiconductor relay device 312. A switching signal S2 which controls the emission of light and corresponds to an inverse signal of the switching signal S1, is inputted to the other input terminal of the light-emitting unit of the photosemiconductor relay device 313. A power source potential of 5V is electrically connected to the other input terminal of the light-emitting unit of the photosemiconductor relay device 314. Reference numeral 315 indicates a control unit for controlling the power supply unit 310.

The operation of the power supply apparatus shown in FIG. 10 will now be described.

Either of the photosemiconductor relay devices 311 and 312 and the photosemiconductor relay devices 313 and 314 are turned on in response to either of the switching signals S1 and S2. A load current flows between the positive and negative sides of the power supply unit 310 and the output terminals 316-1 and 316-2 of the output unit 316, thereby determining the polarities of the output terminals 316-1 and 316-2. Since each of the photosemiconductor relay devices 311 through 314 has the current-limiting function, an overcurrent does not flow in the output unit 316 and the power supply unit 310.

According to the power supply apparatus of the present invention, as has been described above, since an overcurrent does not flow, a bad influence such as malfunction or the like is not exerted on the output unit 316 and the power supply unit 310.

Figure 11:
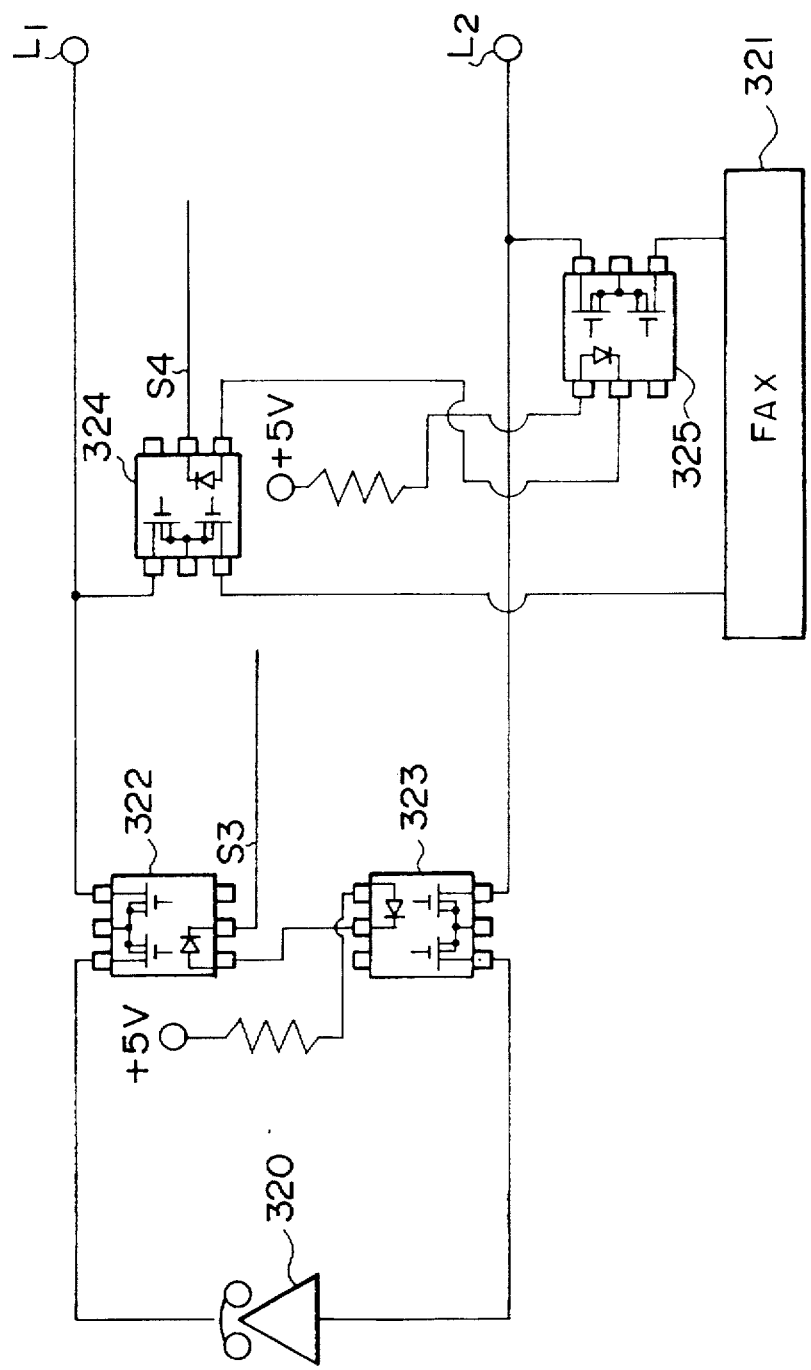
FIG. 11 is a view showing a configuration of a terminal switching apparatus according to the present invention.

FIG. 11 is a view illustrating the configuration of a terminal switching apparatus according to the present invention.

Photosemiconductor relay devices 322 through 325 each using a photosemiconductor relay according to the first or second embodiment are employed in the terminal switching apparatus.

One of the output terminals of the photosemiconductor relay device 322 and one of the output terminals of the photosemiconductor relay device 323 are electrically connected to a telephone set 320 which serves as a terminal unit. One of the output terminals of the photosemiconductor relay device 324 and one of output terminals of the photosemiconductor relay device 325 are electrically connected to a facsimile (FAX) 321 which serves as a terminal unit. The other of the output terminals of the photosemiconductor relay device 322 and the other of the output terminals of the photosemiconductor relay device 324 are electrically connected to a metallic line L1. The other of the output terminals of the photosemiconductor relay device 323 and the other of the output terminals of the photosemiconductor relay device 325 are electrically connected to a metallic line L2. One of the input terminals of the photosemiconductor relay device 322 and one of the input terminals of the photosemiconductor relay device 323 are electrically connected to each other. One of input terminals of the photosemiconductor relay device 324 and one of input terminals of the photosemiconductor relay device 325 are electrically connected to each other. A switching signal S4 is inputted to the other of the input terminals of the photosemiconductor relay device 322. A switching signal S5 corresponding to an inverse signal of the switching signal S4 is inputted to the other of the input terminals of the photosemiconductor relay device 322. A power source potential of 5V is electrically coupled to the other of the input terminals of the photosemiconductor relay device 323. A power source potential of 5V is electrically connected to the other of the input terminals of the photosemiconductor relay device 325.

The operation of the terminal switching apparatus shown in FIG. 11 will now be described. Either of the photosemiconductor relay devices 322, 323 and the photosemiconductor relay devices 324, 325 are turned on in response to the switching signal S3 or S4 to connect the telephone set 320 or the FAX 321 to the metallic lines L1 and L2, thereby making it possible to start to communicate. Since, at this time, each of the photosemiconductor relay devices 322 through 325 has a current-limiting function, an excessive current does not flow in a metallic lines even if the thunderbolt falls. Therefore, communications can be performed without any hindrance.

The present invention is not necessarily limited to the above embodiments. Various changes and modifications can be made. For example, the following modification is disclosed as one of the modifications.

Bipolar transistors can be used as an alternative to the MOS transistors 41 and 42. Another type of transistor and a resistor can be used as an alternative to the PNP transistor 24.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A photosemiconductor relay comprising:

a light-emitting unit for emitting light therefrom;

a first connecting terminal;

a second connecting terminal;

a light-receiving control circuit connected to said first and second connecting terminals, said light-receiving control circuit maintaining a difference in potential between said first and second connecting terminals at a predetermined potential difference or more during a first period in which the light is being received, the light-receiving control circuit having a photodiode array and a control circuit which is coupled to the first and second connecting terminals, the control circuit electrically connecting said first and second connecting terminals to each other after the elapse of the first period, the photodiode array having an anode end and a cathode end, said cathode end being connected to said second connecting terminal, said control circuit including:

a diode having an anode and a cathode, said anode being connected to said anode end of said photodiode array and said cathode being connected to said first connecting terminal, a first transistor having first, second, and third electrodes, said first electrode being connected to said first connecting terminal and said second electrode being connected to said anode of said diode, a second transistor having fourth, fifth, and sixth electrodes, said fourth electrode being connected to said anode of said diode, said fifth electrode being connected to said third electrode, and said sixth electrode being connected to said cathode end of said photodiode array, and a photodiode having an anode and a cathode, said anode of said photodiode being connected to said cathode end of said photodiode array and said cathode of said photodiode being connected to said third electrode, a first terminal;

a second terminal; and a switching circuit including:

a third transistor having a seventh electrode connected to said first connecting terminal, an eighth electrode connected to said first terminal, and a ninth electrode, a fourth transistor having a tenth electrode connected to said first connecting terminal, an eleventh electrode connected to said second terminals and a twelfth electrode, a first resistor having one end connected to the ninth electrode and the other end connected to said second connecting terminal, a second resistor having one end connected to the twelfth electrode and the other end connected to said second connecting terminal, fifth transistor having a thirteenth electrode connected to the one end of the first resistor, a fourteenth electrode connected to the other end of the first resistor, and a fifteenth electrode connected to said first connecting terminal, and a sixth transistor having a sixteenth electrode connected to the one end of the second resistor, a seventeenth electrode connected to the other end of the second resistor, and an eighteenth electrode connected to said first connecting terminal;

wherein said switching circuit electrically connects said first terminal and said second terminal to each other in response to the predetermined potential difference or more supplied to the third and fourth transistors and restricts a current flowing between said first and second terminals so as to fall within a predetermined range.

2. A photosemiconductor relay comprising:

a light-emitting unit for emitting light therefrom;

a first connecting terminal;

a second connecting terminal;

a light-receiving control circuit connected to said first and second connecting terminals, for maintaining a difference in potential between said first and second connecting terminals at a predetermined potential difference or more during a first period in which the light is being received;

a first terminal;

a second terminal; and a switching circuit including:

a first transistor having a first electrode connected to said first connecting terminal, a second electrode connected to said first terminal and a third electrode, second transistor having a fourth electrode connected to said first connecting terminal, a fifth electrode connected to said second terminal and a sixth electrode, first resistor having one end connected to the third electrode and the other end connected to said second connecting terminal, a second resistor having one end connected to the sixth electrode and the other end connected to said second connecting terminal, a third transistor having a seventh electrode connected to the one end of the first resistor, an eighth electrode connected to the one end of the second resistor and a ninth electrode connected to said first connecting terminal, and a fourth transistor having a tenth electrode connected to the one end of the second resistor, an eleventh electrode connected to the one end of the first resistor and a twelfth electrode connected to said first connecting terminal;

wherein said switching circuit electrically connects said first terminal and said second terminal to each other in response to the predetermined potential difference or more applied to the first and second transistors and restricts a current flowing between said first and second terminals so as to fall within a predetermined range.

3. A photosemiconductor relay according to claim 2, wherein said light-receiving control circuit has a control circuit which is coupled to the first and second connecting terminals, the control circuit electrically connecting said first and second connecting terminals after the elapse of the first period.

4. A photosemiconductor relay device including a light-emitting chip, a light-receiving chip disposed so as to be opposed to the light-emitting chip, a first output chip and a second output chip, comprising:

a light-emitting unit for emitting light therefrom;

a first connecting terminal;

a second connecting terminal;

a light-receiving control circuit connected to said first and second connecting terminals, for maintaining a difference in potential between said first and second connecting terminals at a predetermined potential difference or more during a first period in which the light is being received, said light-receiving control circuit including:

a photodiode array having an anode end and a cathode end, said cathode end being connected to said second connecting terminal, a diode having an anode and a cathode, said anode being connected to said anode end of said photodiode array and said cathode being connected to said first connecting terminal, a first transistor having first, second, and third electrodes, said first electrode being connected to said first connecting terminal and said second electrode being connected to said anode of said diode, a second transistor having fourth, fifth, and sixth electrodes, said fourth electrode being connected to said anode of said diode, said firth electrode being connected to said third electrode, and said sixth electrode being connected to said cathode end of said photodiode array, and a photodiode having an anode and a cathode, said anode of said photodiode being connected to said cathode end of said photodiode array and said cathode of said photodiode being connected to said third electrode, a first terminal;

a second terminal; and a switching circuit including:

a third transistor having a seventh electrode connected to said first connecting terminal, an eighth electrode connected to said first terminal and a ninth electrode, a fourth transistor having a tenth electrode connected to said first connecting terminal, an eleventh electrode connected to said second terminal and a twelfth electrode, first resistor having one end connected to the ninth electrode and the other end connected to said second connecting terminal, a second resistor having one end connected to the twelfth electrode and the other end connected to said second connecting terminal, a fifth transistor having a thirteenth electrode connected to the one end of the first resistor, a fourteenth electrode connected to the other end of the first resistor, and a fifteenth electrode connected to said first connecting terminal, and a sixth transistor having a sixteenth electrode connected to the one end of the second resistor, a seventeenth electrode connected to the other end of the second resistors and an eighteenth electrode connected to said first connecting terminal;

wherein said switching circuit electrically connects said first terminal and said second terminal to each other in response to the predetermined potential difference or more supplied to the third and fourth transistors and restricts a current flowing between said first and second terminals so as to fall within a predetermined range, and wherein said light-emitting unit is formed on the light-emitting chip, said light-receiving control circuit and said first and second resistors are formed on the light-receiving chip, said third transistor is formed on the first output chips and said fourth transistor is formed on the second output chip.

5. A photosemiconductor relay device including a light-emitting chip, a light-receiving chip disposed so as to be opposed to the light-emitting chip, a first output chip and a second output chip, comprising:

a light-emitting unit for emitting light therefrom;

a first connecting terminal;

a second connecting terminal;

a light-receiving control circuit connected to said first and second connecting terminals, for holding a difference in potential between said first and second connecting terminals at a predetermined potential difference or more during a first period in which the light is being received;

a first terminal;

a second terminal; and a switching circuit including:

a first transistor having a first electrode connected to said first connecting terminal, a second electrode connected to said first terminal and a third electrode, second transistor having a fourth electrode connected to said first connecting terminal, a fifth electrode connected to said second terminal and a sixth electrode, a first resistor having one end connected to the third electrode and the other end connected to said second connecting terminal, second resistor having one end connected to the sixth electrode and the other connected to said connecting terminal, third transistor having a seventh electrode connected to the one end of the first resistor, an eighth electrode connected to the one end of the second resistor and a ninth electrode connected to said first connecting terminal, and a fourth transistor having a tenth electrode connected to the one end of the second resistor, an eleventh electrode connected to the one end of the first resistor and a twelfth electrode connected to said first connecting terminal;

wherein said switching circuit electrically connects said first terminal and said second terminal to each other in response to the predetermined potential difference or more supplied to the first and second transistors and restricts a current flowing between said first and second terminals so as to fall within a predetermined range, and wherein said light-emitting unit is formed on the light-emitting chip, said light-receiving control circuit and said first and second resistors are formed on the light-receiving chip, said first transistor is formed on the first output chips and said second transistor is formed on the second output chip.

6. A photosemiconductor relay device according to claim 4, wherein said first and second resistors are disposed on said light-receiving chip and symmetrically with respect to each other about a central line of said light-receiving chip.

7. A photosemiconductor relay device according to claim 5, wherein said first and second resistors are disposed on said light-receiving chip and symmetrically with respect to each other about a central line of said light-receiving chip.

8. A photosemiconductor relay device according to claim 6 or 7, wherein pads electrically connected to said first connecting terminal are disposed at four corners of said light-receiving chip.

9. A controller comprising:

a control unit for outputting a control signal therefrom; and a photosemiconductor relay as defined in claim 1, 2 or 3 for switching a driver circuit connected to said first terminal based on the control signal.

10. A power supply apparatus comprising:

a power supply unit for outputting power having a positive or negative polarity therefrom;

an output unit for outputting a signal therefrom in response to the power having the positive or negative polarity; and a plurality of photosemiconductor relays as defined in claim 1, 2 or 3, which serve as switches for changing the polarity of power supplied to said output unit.

11. A terminal switching apparatus comprising:

a first terminal unit;

a second terminal unit; and a plurality of photosemiconductor relays as defined in claim 1, which serve as switches connected to said first and second terminal units, for selecting either one of said first and second terminal units to thereby connect the selected one to a communication line.

12. A photosemiconductor relay device according to claim 7, wherein pads electrically connected to said first connecting terminal are disposed at four corners of said light-receiving chip.

13. A controller comprising:

a control unit for outputting a control signal therefrom; and a photosemiconductor relay as defined in claim 2 for switching a driver circuit connected to said first terminal based on the control signal.

14. A power supply apparatus comprising:

a power supply unit for outputting power having a positive or negative polarity therefrom;

an output unit for outputting a signal therefrom in response to the power having the positive or negative polarity; and a plurality of photosemiconductor relays as defined in claim 2, which serve as switches for changing the polarity of power supplied to said output unit.

15. A terminal switching apparatus comprising:

a first terminal unit;

a second terminal unit; and a plurality of photosemiconductor relays as defined in claim 2, which serve as switches connected to said first and second terminal units, for selecting either one of said first and second terminal units to thereby connect the selected one to a communication line.

16. A photosemiconductor relay according to claim 2, wherein the third and fourth transistors are bipolar transistors, wherein the eighth electrode is the base of the third transistor, and wherein the eleventh electrode is the base of the fourth transistor.

17. A photosemiconductor relay device according to claim 2, wherein said light-receiving control circuit comprises:

- a photodiode array having an anode end and a cathode end, said cathode end being connected to said second connecting terminal;
- a diode having an anode and a cathode, said anode being connected to said anode end of said photodiode array and said cathode being connected to said first connecting terminal;
- a fifth transistor having thirteenth, fourteenth and fifteenth electrodes, said thirteenth electrode being connected to said first connecting terminal and said fourteenth electrode being connected to said anode of said diode;
- a sixth transistor having sixteenth, seventeenth, and eighteenth electrodes, said sixteenth electrode being connected to said anode of said diode, said seventeenth electrode being connected to said fifteenth electrode, and said eighteenth electrode being connected to said cathode end of said photodiode array; and
- a photodiode having an anode and a cathode, said anode of said photodiode being connected to said cathode end of said photodiode array and said cathode of said photodiode being connected to said third electrode.

18. A photosemiconductor relay according to claim 5, wherein the third and fourth transistors are bipolar transistors, wherein the eighth electrode is the base of the third transistor, and wherein the eleventh electrode is the base of the fourth transistor.

19. A photosemiconductor relay device according to claim 5, wherein said light-receiving control circuit comprises:

- a photodiode array having an anode end and a cathode end, said cathode end being connected to said second connecting terminal;
- a diode having an anode and a cathode, said anode being connected to said anode end of said photodiode array and said cathode being connected to said first connecting terminal;
- a fifth transistor having thirteenth, fourteenth and fifteenth electrodes, said thirteenth electrode being connected to said first connecting terminal and said fourteenth electrode being connected to said anode of said diode;
- a sixth transistor having sixteenth, seventeenth, and eighteenth electrodes, said sixteenth electrode being connected to said anode of said diode, said seventeenth electrode being connected to said fifteenth electrode, and said eighteenth electrode being connected to said cathode end of said photodiode array; and
- a photodiode having an anode and a cathode, said anode of said photodiode being connected to said cathode end of said photodiode array and said cathode of said photodiode being connected to said third electrode.

* * * * *

UNITED STATES PATENT AND TRADEMARK OFFICE
CERTIFICATE OF CORRECTION

PATENT NO. : 5,757,020
DATED : 5/26/98
INVENTOR(S) : Torazawa et al.

It is certified that error appears in the above-identified patent and that said Letters Patent is hereby corrected as shown below:

Column 12, line 41, change "firth" to --fifth--.

Column 13, line 49, after "said" insert --second--.

Signed and Sealed this

Ninth Day of February, 1999

Attest:

Acting Commissioner of Patents and Trademarks

Attesting Officer